United States Patent
Chen et al.

(10) Patent No.: US 7,274,544 B2
(45) Date of Patent: Sep. 25, 2007

(54) GATE-COUPLED ESD PROTECTION CIRCUIT FOR HIGH VOLTAGE TOLERANT I/O

(75) Inventors: Ker-Min Chen, Hsinchu (TW); Cheng-Ming Chiang, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 220 days.

(21) Appl. No.: 10/971,271

(22) Filed: Oct. 21, 2004

(65) Prior Publication Data

US 2006/0087779 A1   Apr. 27, 2006

(51) Int. Cl.
  *H02H 9/00* (2006.01)
(52) U.S. Cl. ...................................... 361/56
(58) Field of Classification Search .................. 361/56, 361/91.1
  See application file for complete search history.

(56) References Cited

U.S. PATENT DOCUMENTS

| | | | |
|---|---|---|---|
| 5,780,897 A * | 7/1998 | Krakauer | 257/368 |
| 6,140,682 A * | 10/2000 | Liu et al. | 257/355 |
| 6,300,800 B1 * | 10/2001 | Schmitt et al. | 326/86 |
| 6,611,407 B1 | 8/2003 | Chang | |
| 6,724,601 B2 | 4/2004 | Lien et al. | |
| 6,724,677 B1 | 4/2004 | Su et al. | |
| 6,727,554 B1 | 4/2004 | Yang | |
| 6,734,054 B2 | 5/2004 | Tang et al. | |
| 6,737,682 B1 | 5/2004 | Yu | |
| 6,738,242 B1 | 5/2004 | Kwong et al. | |
| 6,898,062 B2 * | 5/2005 | Russ et al. | 361/56 |

* cited by examiner

*Primary Examiner*—Stephen W. Jackson
*Assistant Examiner*—Boris Benenson
(74) *Attorney, Agent, or Firm*—Duane Morris LLP

(57) ABSTRACT

The present disclosure is directed toward electrostatic device protection for semiconductor devices. A circuit for providing electro-static discharge (ESD) protection for a semiconductor circuit may comprise a first circuit coupled to a voltage bus and to the gate of a first transisto, the first circuit comprising a metal-oxide semiconductor (MOS) transistor; and a second circuit coupled to the voltage bus, to ground, and to the gate of the transistor of the first circuit. The MOS transistor of the first circuit may be a PMOS transistor whose source is coupled to the voltage bus, whose drain is coupled to the gate of the first transistor, whose gate is coupled to the second circuit, and whose well is coupled to a floating N-well.

22 Claims, 4 Drawing Sheets

GATE-COUPLED ESD PROTECTION CIRCUIT FOR HIGH VOLTAGE TOLERANT I/O

BACKGROUND

The present disclosure relates generally to electrostatic device protection for semiconductor devices.

Electrostatic discharge, hereinafter "ESD," is a common phenomenon that occurs during handling of semiconductor integrated circuit ("IC") devices. An electrostatic charge may accumulate for various reasons and produce potentially destructive effects on an IC device. Damage typically may occur during a testing phase of IC fabrication or during assembly of the IC onto a circuit board, as well as during use of equipment into which the IC has bean installed. Damage to a single IC due to poor ESD protection in an electronic device can partially or sometimes completely hamper its functionality. ESD protection for semiconductor ICs is, therefore, a reliability issue of paramount concern.

Typically, there are few gate-coupled effects between an I/O pad and a first poly gate, if any at all. A prior art dynamic floating gate circuit 1 is shown in FIG. 1. A Resistor-Capacitor (RC) circuit 3 is electrically located between a voltage bus 5 and a ground or ground voltage 4. The I/O pad 2 is connected to an I/O bus 6. The floating gate circuit 1 is constrained in that the PMOS side 7 must have diode path shown as 10 to charge the RC circuit 3 for controlling the floating gate of the cascaded transistors. Because of this constraint dynamic floating gate circuits, while acceptable for regular (non-HVT) I/O applications, are not useful in HVT applications.

FIG. 2 is a prior art ESD circuit 200 for HVT I/O applications. The circuit 200 contains two sets of cascaded NMOS transistors 230 and 240. The first poly gate in each set is typically tied to the voltage bus 5, e.g. a 3.3 v bus. Similar to many prior art circuits, the circuit 200 includes a soft pull component 203, e.g. a dynamic floating gate similar to that shown in FIG. 1. The soft pull component 203, however, may not function due to PMOS floating well blocking in the diode path from the input/output (I/O) pad 2 to the voltage bus 5. As a result, there is no gate-coupling effect and the fingers, whether used or not used, may be non-uniformly triggered by an ESD event, e.g. path 210 and path 211 are not uniform. This results in a poor level of ESD protection and necessitates an ESD implant. Unfortunately, the ESD implant requires changes to the mask and, hence, increases costs and complexity. Additionally it would be advantageous for a circuit level ESD protection scheme independent of the mask for the IC which would also reduce cell size. Such a circuit level ESD protection would beneficially be available for use with existing ICs.

Therefore, in order to obviate the deficiencies in the prior art, it is an object of the present disclosure to present an ESD protection circuit for HVT I/O devices. The circuit in one embodiment having a first circuit coupled to a voltage bus and to the gate of a first transistor, the first circuit comprising a metal-oxide semiconductor (MOS) transistor (11); and a second circuit coupled to the ground and to the gate of the transistor (11) of the first circuit.

It is also an object of the present disclosure to present an improved circuit for providing high voltage tolerant ESD protection for a semiconductor circuit. The improvement including a gate coupling circuit between the first transistors of each of two cascaded transistor sets.

It is another object of the present disclosure to present in a circuit for providing high voltage tolerant ESD protection for a semiconductor, a method for improving ESD protection. The method including providing a gate coupling circuit between the first transistors of two cascaded transistor sets; removing one or more of the plurality of fingers; removing the soft pull circuit; and, tying-off one or more of the cascaded transistor sets.

It is still another object of the present disclosure to present in a circuit for providing high voltage tolerant ESD protection for a semiconductor circuit a method for uniformly turning on each of the fingers during an ESD event. The method including coupling the gates of the first transistors of the cascaded transistor sets with a gate coupling circuit.

These objects and other advantages of the disclosed subject matter will be readily apparent to one skilled in the art to which the disclosure pertains from a perusal or the claims, the appended drawings, and the following detailed description of the preferred embodiments

DETAILED DESCRIPTION

Figure 1:
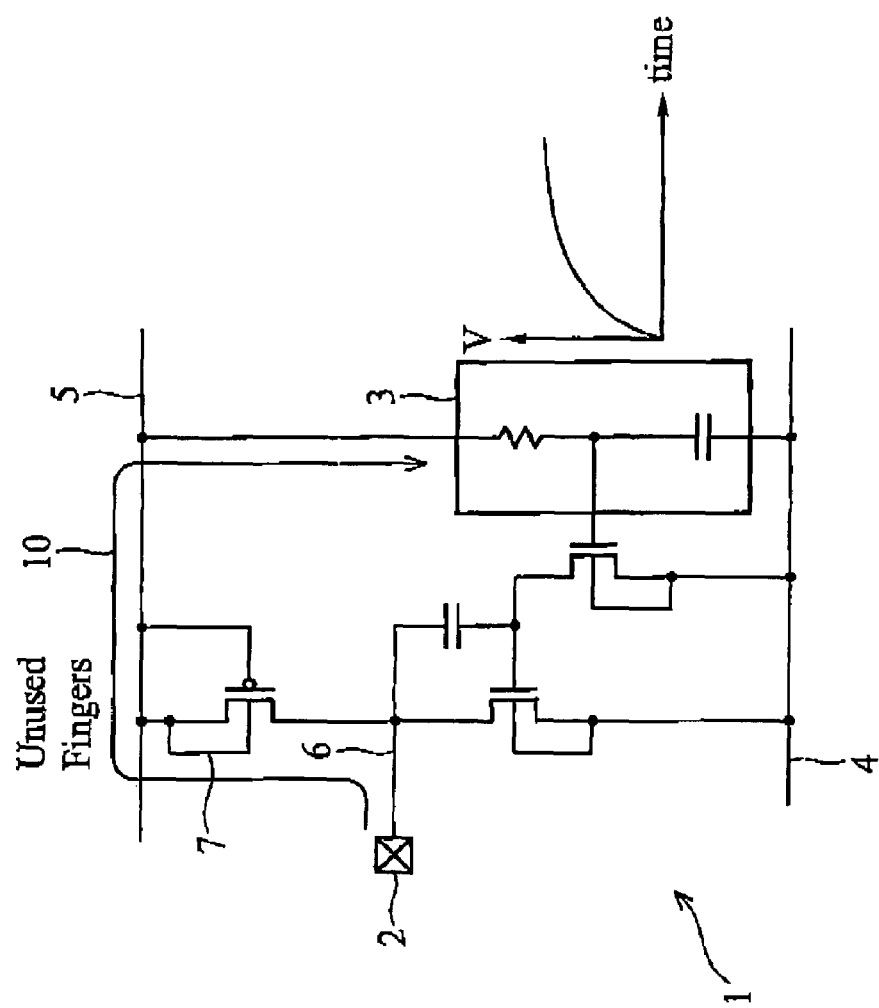
FIG. 1 is a schematic representation of a prior art dynamic floating gate circuit.
Figure 2:
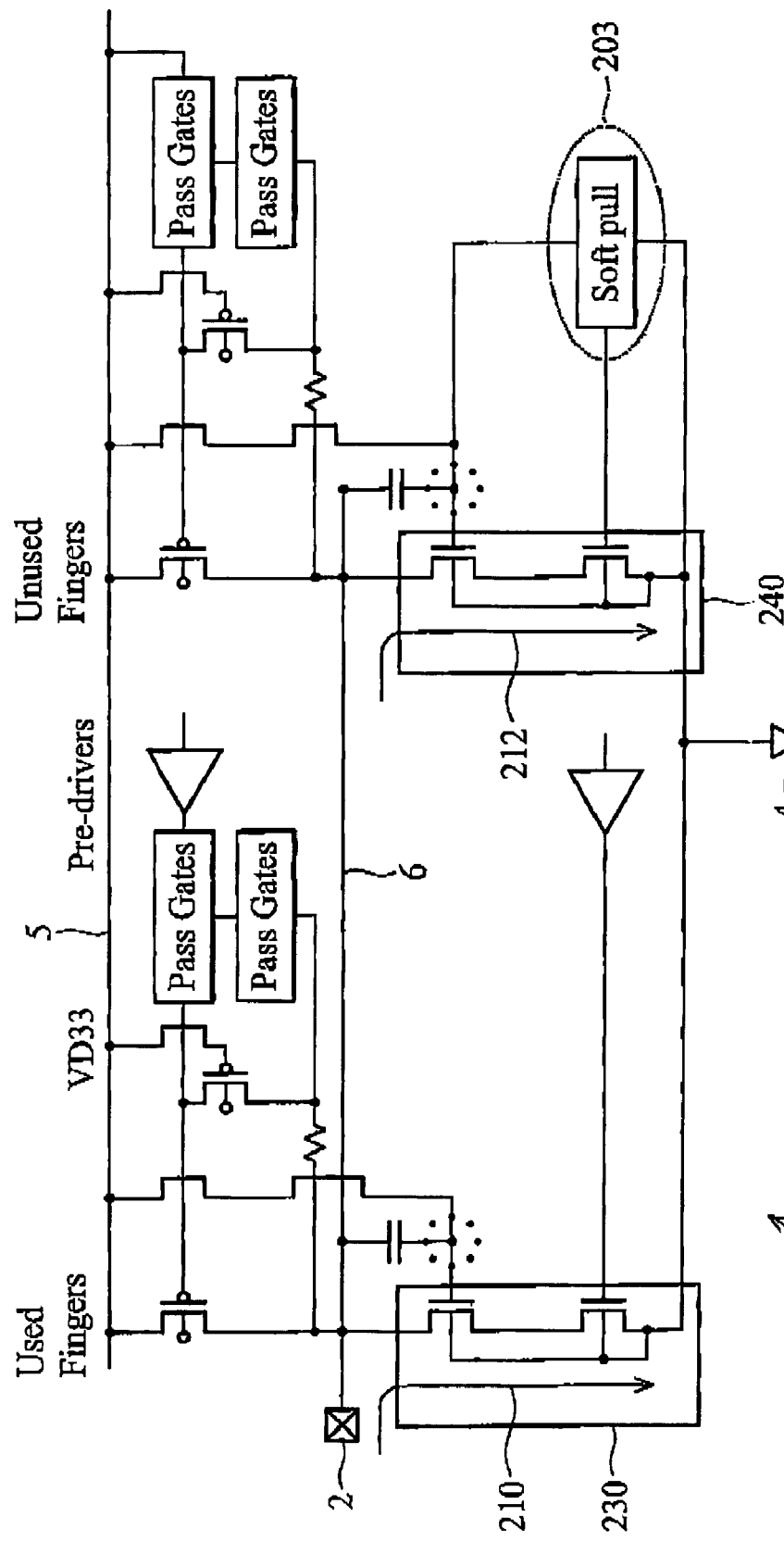
FIG. 2 is a schematic representation of a prior art ESD circuit for HVT I/O.
Figure 3:
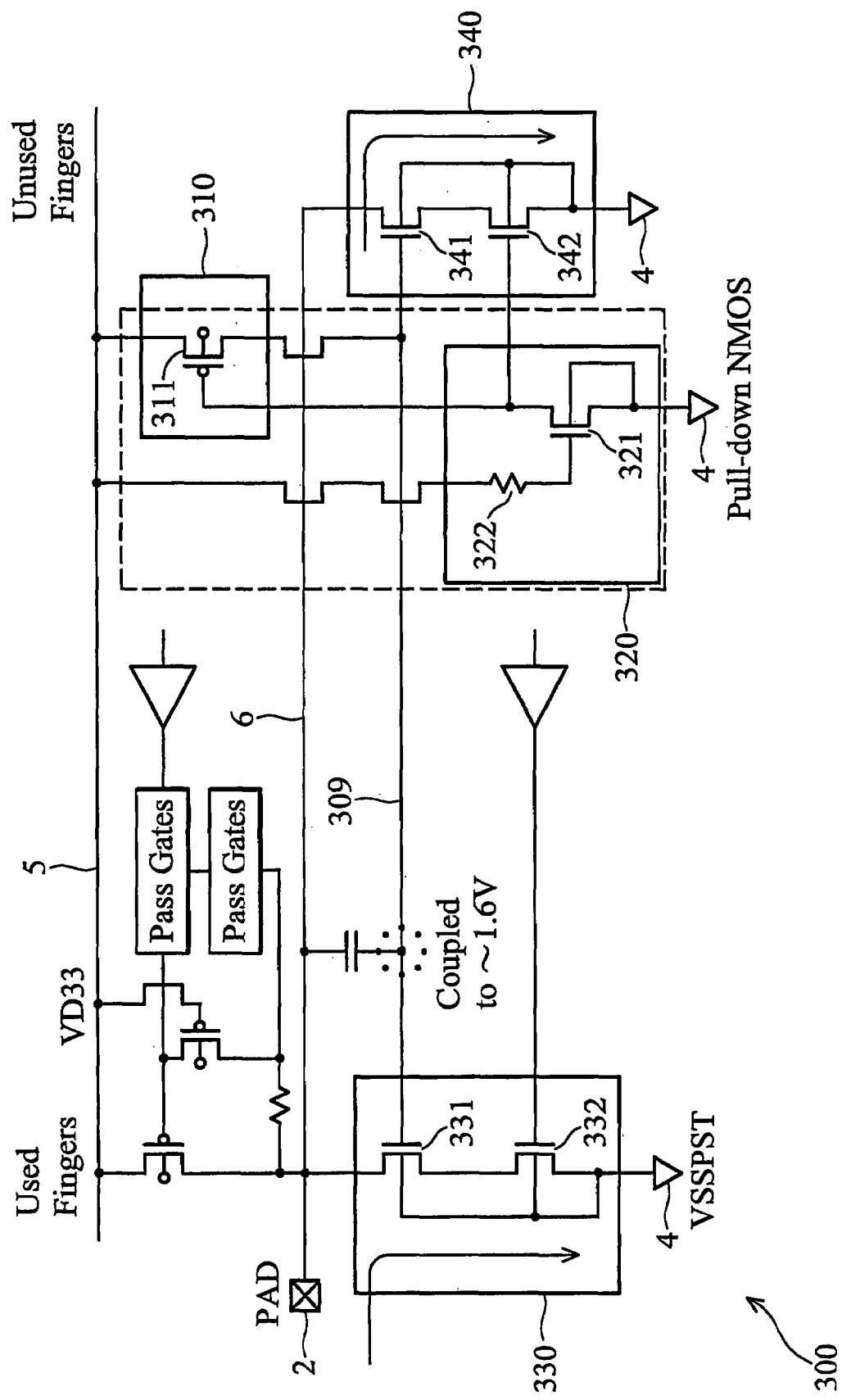
FIG. 3 is a schematic layout of an embodiment of the present disclosure.

Referring now to FIG. 3, circuit 300 provides high voltage tolerant ESD protection for a semiconductor. The circuit 300 includes a gate coupling circuit including a first circuit 310 and second circuit 320. The first circuit 310 and the second circuit 320 are located in place of the unused finger of FIG. 2.

The first circuit 310 comprises transistor 311 which is coupled at its source to voltage bus 5 and at its drain to the gate of first transistor 341 of the cascaded set of transistors 340. The gate of first transistor 341 may be further coupled to another current path 309. Current path 309, which may be part of the gate coupling circuit, couples the gates of the first transistor 341 of set 340 to the first transistor 331 of the set 330. Additionally, the first transistor 341 may be coupled to I/O bus 6. The I/O bus 6 may be coupled to I/O pad 2.

In a preferred embodiment, transistor 311 is a metal-oxide semiconductor (MOS) transistor. In a further preferred embodiment, MOS transistor 311 is a PMOS transistor wherein the source of PMOS transistor 311 is coupled to voltage bus 5, the drain of PMOS transistor 311 is coupled to the gate of first transistor 341, the gate of PMOS transistor 311 is coupled to second circuit 320, and the well (or body) of PMOS transistor 311 is coupled to a floating N-well.

The second circuit 320 comprises transistor 321 and resistor 322. Transistor 321 is coupled to the resistor 322 at its gate as well as to the voltage bus 5, via the same resister 322. The transistor 321 is coupled, via its source to ground 4, and to the gate of transistor 311 at its drain. The resistor 322 as shown is coupled to voltage bus 5. Transistor 321 may be an NMOS transistor 321 coupled to first circuit 310 and to ground 4 and resistor 322 may be coupled to voltage bus 5 and to the gate of NMOS transistor 321. In a preferred embodiment, the source of NMOS transistor 321 is coupled to ground 4, the gate of NMOS transistor 321 is coupled to voltage bus 5, via the resister 322, and the drain of NMOS transistor 321 is coupled to first circuit 310. In this embodiment, the first circuit 310 includes a PMOS transistor 311, the drain of NMOS transistor 321 may be coupled to the gate of PMOS transistor 311. The body of NMOS transistor 321 may be coupled to substrate bus 4 which may be adapted to provide a substrate voltage or ground voltage.

The first circuit 310 is applied to a gate of a cascaded NMOS transistor, e.g. first transistor 341. Further, the second circuit 320 may be applied to a gate of a cascaded NMOS transistor, e.g. second transistor 342. In certain embodiments, the second transistor 342 may be coupled to both ground 4 and its gate to the drain of NMOS transistor 321, which is tied to the gate of PMOS 311.

Figure 4:
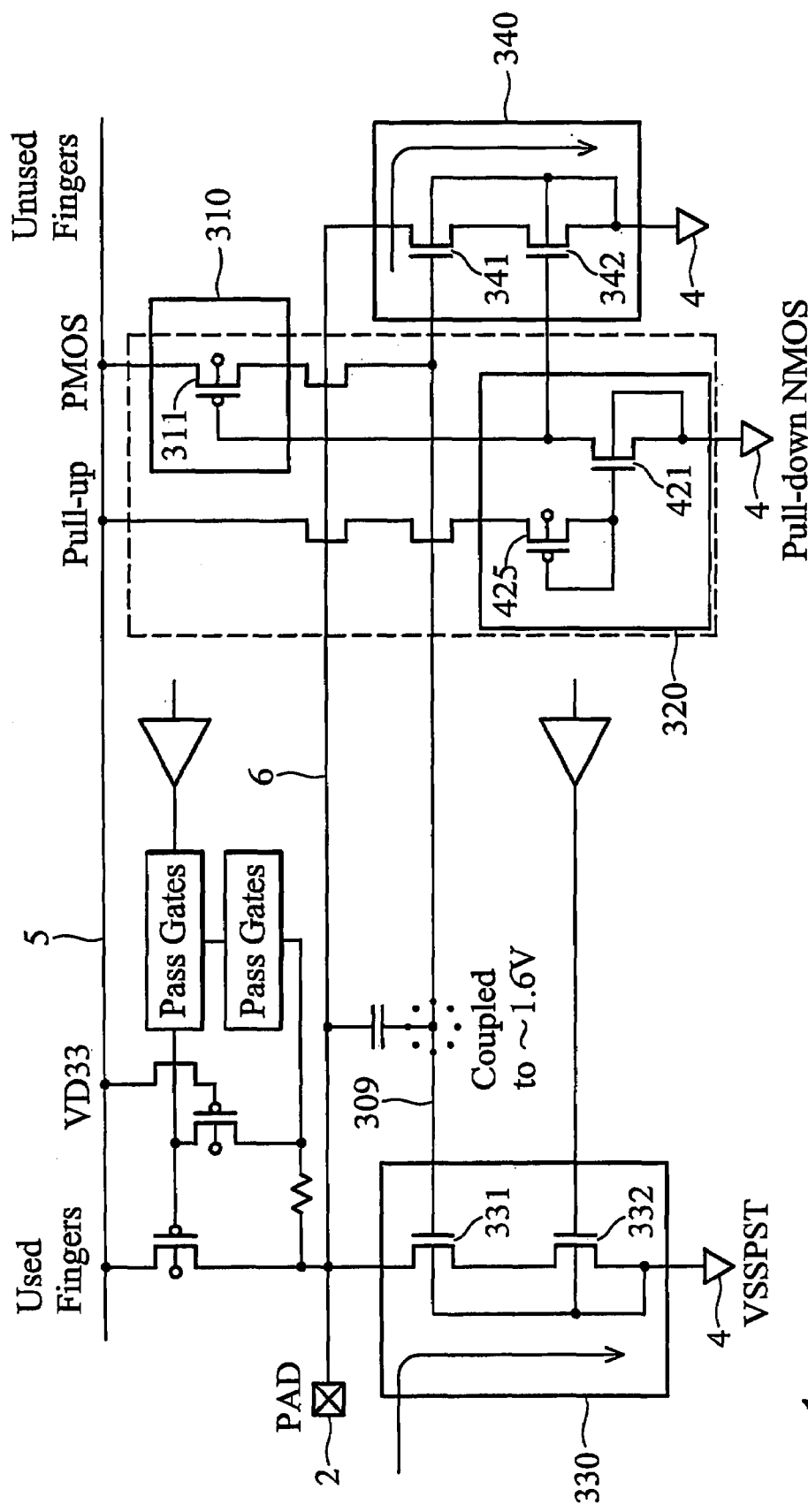
FIG. 4 is a schematic layout of another embodiment of the present disclosure.

Referring now to the circuit 400 of FIG. 4, in certain embodiments, the resistor 322 (as shown in FIG. 3) can be replaced with PMOS transistor 425 to form the second circuit 420. In these embodiments, the source of PMOS transistor 425 may be coupled to voltage bus 5, the gate of PMOS transistor 425 may be coupled to its drain, and the drain of PMOS transistor 425 may be coupled to the gate of NMOS transistor 421.

One aspect of the disclosed embodiments that provides improved ESD protection is that the gates of the first transistors 331 and 341 are coupled and as such facilitate the uniform activation of the used and unused fingers. The uniform activation allows for better dissipation of the electrostatic charge from the I/O pad 2.

Another aspect of embodiments of the present disclosure is they are readily adapted from prior art circuits as described in FIG. 2. The prior art circuit as shown in FIG. 2 can readily be transformed into disclosed embodiments. The unused PMOS fingers and soft pull circuit 203 can be removed from the circuit and the unused NMOS fingers tied off. A gate coupling circuit including the first 310 and second circuits 320 as described above can then be added. The gates of the first transistors are also removed from direct connection to the voltage bus 5. These modifications can result in the embodiments as described above.

It will be understood that various changes in the details, materials, and arrangements of the parts which have been described and illustrated above in order to explain the nature of this disclosure may be made by those skilled in the art without departing from the principle and scope of the disclosure as recited in the appended claims.

What is claimed is:

1. A circuit for providing electro-static discharge (ESD) protection for a semiconductor circuit, comprising:
   a. a first transistor and a second transistor coupled in series between protected node and ground;
   b. a first control circuit coupled to a voltage bus and to the gate of the first transistor; and
   c. a second circuit coupled to ground and to the gate of the second transistor.

2. The circuit of claim 1, wherein the first control circuit comprises a metal-oxide semiconductor (MOS) transistor.

3. The circuit of claim 1, wherein the second control circuit is further coupled to the gate of the transistor of the first circuit.

4. The circuit of claim 1, wherein the second control circuit is further coupled to the voltage bus.

5. The circuit of claim 2, wherein the MOS transistor of the first control circuit is a PMOS transistor.

6. The circuit of claim 5, wherein the source of the PMOS transistor is coupled to the voltage bus, the drain of the PMOS transistor is coupled to the gate of the first transistor, the gate of the PMOS transistor is coupled to the second control circuit, and the well of the PMOS transistor is coupled to a floating N-well.

7. The circuit of claim 1, wherein the second control circuit further comprises:
   a. an NMOS transistor coupled to the first control circuit and to ground; and
   b. a resistor coupled to the voltage bus and to the gate of the NMOS transistor.

8. The circuit of claim 7, wherein the source of the NMOS transistor is coupled to ground, the gate of the NMOS transistor is coupled to the voltage bus, and the drain of the NMOS transistor is coupled to the first control circuit.

9. The circuit of claim 8, wherein:
   a. the first circuit further cormprises a PMOS transistor; and
   b. the drain of the NMOS transistor is coupled to the gate of the PMOS transistor.

10. The circuit of claim 7, wherein the bulk of the NMOS transistor is coupled to a substrate bus adapted to provide a substrate voltage.

11. The circuit of claim 1, wherein the second control circuit further comprises:
   a. a NMOS transistor coupled to the first control circuit and to ground; and
   b. a PMOS transistor coupled to the voltage bus and to the gate of the NMOS transistor.

12. The circuit of claim 11, wherein the source of the PMOS transistor is coupled to the voltage bus, the gate of the PMOS transistor is coupled to the drain of the PMOS transistor, and the drain of the PMOS transistor is coupled to the gate of the NMOS transistor.

13. The circuit of claim 7, wherein the first control circuit is applied to a gate of first NMOS transistor.

14. The circuit of claim 7, wherein the second control circuit is applied to a gate of second NMOS transistor.

15. The circuit of claim 14, wherein:
   a. the first transistor is coupled to an input/output (I/O) bus; and
   b. the I/O bus is coupled to an I/O pad.

16. The circuit of claim 15, wherein the second transistor is coupled to ground and the gate of NMOS transistor.

17. A circuit for providing electro-static discharge (ESD) protection for a semiconductor circuit having two fingers, a voltage bus, two-transistor sets between an I/O pad and a ground voltage, each transistor set having a first transistor, the improvement comprising a gate coupling circuit between the first transistors of each of the two transistor sets.

18. The circuit of claim 17, wherein the gate coupling circuit comprises:
   a first control circuit coupled to the voltage bus and to a gate of the first transistor of one of the transistor sets, the first circuit comprising a metal-oxide semiconductor (MOS) transistor; and
   a second control circuit coupled to the ground voltage and to a gate of the transistor of the first circuit.

19. The circuit of claim 17, wherein the gate coupling circuit is adapted such that the body effect in an ESD event maintains a voltage on the gates of the first transistors.

20. The circuit of claim 17, wherein the transistors in each of the transistor sets are NMOS transistors.

21. The circuit of claim 17, wherein the fingers are finger MOS transistors.

22. In a circuit for providing high voltage tolerant electro-static discharge (ESD) protection for a semiconductor circuit having a plurality of fingers, a voltage bus, a plurality of transistor sets between an I/O pad and a ground voltage, each transistor set having a first transistor and a second transistor, a method for uniformly turning on each of the plurality of fingers during a ESD event comprising; coupling the gates of the first transistors of each of the plurality of transistor sets with a gate coupling circuit.

* * * * *

UNITED STATES PATENT AND TRADEMARK OFFICE
CERTIFICATE OF CORRECTION

PATENT NO. : 7,274,544 B2
APPLICATION NO. : 10/971271
DATED : September 25, 2007
INVENTOR(S) : Ker-Min Chen It is certified that error appears in the above-identified patent and that said Letters Patent is hereby corrected as shown below:

Column 3, line 49, delete "second circuit" and insert -- second control circuit -- therefor.

Column 4, line 10, delete "first circuit" and insert -- first control circuit -- therefor.

Column 4, line 10, delete "cormprises" and insert -- comprises -- therefor.

Signed and Sealed this

First Day of April, 2008

JON W. DUDAS
*Director of the United States Patent and Trademark Office*